United States Patent

Holst et al.

[11] Patent Number: 5,882,366
[45] Date of Patent: Mar. 16, 1999

[54] ALTERNATING WASH/DRY WATER SCRUBBER ENTRY

[75] Inventors: Mark Holst, Concord, Calif.; Patrick Balliew, Fort Collins, Colo.

[73] Assignees: ATMI Ecosys Corporation, San Jose; Hewlett-Packard Corporation, Palo Alto, both of Calif.

[21] Appl. No.: 870,705

[22] Filed: Jun. 6, 1997

[51] Int. Cl.⁶ .................................................. B01D 41/00
[52] U.S. Cl. .......................... 55/431; 134/166 C; 96/228; 96/426
[58] Field of Search .............................. 55/227, 242, 271, 55/273, 431; 261/99, 104, 112.1; 95/26; 137/238, 240, 861; 134/22.12, 26, 30, 166 C; 96/228, 424, 426, 132, 167, 169

[56] References Cited

U.S. PATENT DOCUMENTS

| | | |
|---|---|---|
| 2,857,979 | 10/1958 | Van Dijck . |
| 3,097,936 | 7/1963 | Lincoln ...................................... 55/273 |
| 3,888,955 | 6/1975 | Maruko ..................... 261/104 |
| 4,986,838 | 1/1991 | Johnsgard . |
| 5,113,789 | 5/1992 | Kamian . |
| 5,118,286 | 6/1992 | Sarin . |
| 5,575,636 | 11/1996 | Kobayashi et al. . |
| 5,704,990 | 1/1998 | Krambrock et al. .................. 134/22.12 |

OTHER PUBLICATIONS

Abrea, et al., Causes of anomalous solid formation in the exhaust system of low–pressure chemical vapor deposition plasma enhanced chemical vapor deposition semiconductor processes, J. Vac. Sci. Technol B 12(4) Jul./Aug. 1994, pp. 2763–2767.

*Primary Examiner*—C. Scott Bushey
*Attorney, Agent, or Firm*—Steven J. Hultquist; Oliver A. M. Zitzmann

[57] ABSTRACT

An apparatus for conveying a process gas stream from an upstream source to a downstream treatment unit, including a manifold receiving gas from the upstream source, including first and second valved inlet lines which are alternatingly employed to flow gas to a downstream process. The manifold is arranged so that one of such lines is actively flowing gas from the upstream source to the downstream process, while the other is blocked by closure of the valve therein and is undergoing regeneration. A pressurized water source is coupled with the manifold, by valved water flow lines to each of the first and second inlet lines, with the water flow line valves being selectively openable or closeable to establish or discontinue flow of pressurized water therethrough, respectively. Cycle timer control means are employed to control the operation of the manifold and valves, for water cleaning of the off-stream inlet line.

23 Claims, 6 Drawing Sheets

ALTERNATING WASH/DRY WATER SCRUBBER ENTRY

CROSS REFERENCE TO RELATED APPLICATIONS

This application is related to U.S. application Ser. No. 08/778,386, filed 31 Dec. 1996, entitled "Clog-Resistant Entry Structure for Introducing a Particulate Solids-Containing and/or Solids Forming Gas Stream to a Gas Processing System;" and to U.S. application Ser. No. 08/775,838, filed on 31 Dec. 1996, entitled "Effluent Gas Stream Treatment System Having Utility for Oxidation Treatment of Semiconductor Manufacturing Effluent Gases".

BACKGROUND OF THE INVENTION

1. Field of the Invention

The present invention generally relates to the field of gas stream scrubbing technology. More particularly, the present invention relates to a method and an apparatus for maintaining inlet duct lines of scrubber units free from clogging due to accumulation of particulates and the like.

2. Description of the Related Art

It is common in the treatment of industrial waste gas streams to integrate a cleaning apparatus downstream (relative to the direction of waste flow) of a processing system. The function of the cleaning apparatus is to receive and process effluents produced in upstream process operations.

For example, in the semiconductor manufacturing industry, numerous integrated cleaning systems are commercially available and oftentimes employed for treating effluents and off-gases from semiconductor manufacturing processes. Semiconductor manufacturing processes may include chemical vapor deposition, metal etching, and etch and ion implantation operations. Examples of commercial integrated gas stream cleaning systems include the Delatech Controlled Decomposition Oxidizer, the Dunnschicht Analagen System Escape system, and the Edwards Thermal Processing Unit. Each of these systems include a thermal processing unit for oxidative decomposition of effluent gases, combined with a wet quench for temperature control of off-gases from a hot oxidation section, and wet scrubbing systems for a removal of acid gases and particulates found in the oxidation process.

Scrubbers, like the ones employed above, generally include elongated columns that accommodate effluents and subject them to a counter-current contacting with liquid solvents, reactant solutions, or slurries. The result of the counter-current contacting is an intimate mixing which assists the absorption process to effect removal of impurities from the effluents.

Integrated cleaning systems may be built into the manufacturing system to be an integral part of the manufacturing system. In contrast, stand-alone systems are maintained in a housing structure independent from the process or manufacturing system. Although such stand-alone units may be integrated to the process of the upstream equipment, stand-alone units enjoy a greater degree of mobility than their integrated cleaning system counterparts.

Use of scrubber technology is not limited to integrated cleaning systems but may also be incorporated in stand-alone operation systems. Examples include: a) unheated chemically reacting packed bed dry scrubbers, b) unheated chemisorptive packed bed dry scrubbers, c) heated chemically reacting packed bed dry scrubbers, d) heated catalytically reacting packed bed dry scrubbers, e) wet scrubbers, and f) flame-based thermal treatment units. Each of the aforementioned units is applicable to selected usages depending on the nature of the gas stream undergoing treatment.

Use of scrubber technology is accompanied by various deficiencies, including particulate clogging of the scrubber inlets, lines and manifolds. A line and/or manifold that is even partially clogged prevents the efficient flow of process gases therethrough. Partially clogged lines or manifolds could also interfere with the absorption processes occurring with the normal operations of a scrubber, e.g., dissolution of a gaseous component or components in a solvent medium.

In application to scrubbing of effluent gas streams, various causes for clogging of scrubbers have been suggested. Clogging can be caused by the reaction of silicon bearing in-coming species reacting with water, or water vapor, and depositing droplets of silicon-containing water in the inlet of a scrubber. This clog-formation mechanism is present for processes applied to semiconductor tools used for epitaxial growth on wafers and which tend to use trichloro silane and dichloro silane. Clogging can also be caused by the condensation deposition of condensable species in the inlet section to a water scrubber. Clogging may also be caused by the back-migration of water vapor from a water scrubber into the incoming process line. This back-migrating water vapor can then react with incoming species and form materials with low volatility and result in their depositing in the inlet to a water scrubber. This last mechanism is, for example, characteristic of scrubber abatement of tools for the metal etch process.

During metal etching machining, e.g., an off-gas such as $BCl_3$ (boron trichloride) may be produced. $BCl_3$ reacts with water vapor to form a non-volatile particulate boric acid which condenses, accumulates, and at least partially clogs inlet ports or inlet lines.

Existing practice has several methods to attempt to eliminate these types of clogs. One method attempts to flush the clog periodically with water. This subjects the clog to a pressurized water stream that dissolves the clog and the clog is flushed away. An undesirable effect of the flushing process is, however, the back migration of water will now originate from the point of introduction of flush water and result in increased hydrolysis reactions upstream with other water sensitive gases, such as WF6 (tungsten hexafluoride), and merely cause the clog to move further upstream.

Another method utilizes the introduction of a mechanical plunger mechanism or other solid removal means to keep the inlet and lines free of solids accumulations. However, such mechanical solutions are costly, labor-intensive, require significant maintenance and are susceptible to mechanical breakdown.

It is therefore an object of the present invention to provide an improved method and apparatus for cleaning scrubber manifold lines so as to reduce the tendency for clog formation in the lines, the scrubber inlets and the manifolds.

It is another object of the present invention provide such an apparatus and method which prevents the back-migration of process water.

It is another object of the present invention to prevent hydrolysis reactions and minimize particulate accumulation.

It is still another object of the present invention to provide method and apparatus of the above-described type which has minimal interference with the operation of the scrubber.

Other objects and advantages of the invention will be more fully apparent from the ensuing disclosure and appended claims.

SUMMARY OF THE INVENTION

In one aspect, the present invention relates to an apparatus and method for cleaning inlet lines of a manifold, which conveys a process gas stream to a downstream treatment unit, e.g., a scrubber unit in the case of semiconductor manufacturing effluent gas streams.

The apparatus includes a manifold receiving gas from an upstream source, e.g., a semiconductor manufacturing process system or tool. The manifold includes first and second inlet lines, which are alternatingly employed to flow gas to a downstream process. These lines at their first (upstream) ends are joined to a manifold conduit, and each of the first and second inlet lines at their second (downstream) ends are joined in flow communication with the downstream process unit, which may for example comprise a scrubber unit.

Each of the first and second inlet lines includes a valve therein, e.g., a pneumatic valve, which is selectively openable or closeable to establish or discontinue flow of gas therethrough, respectively.

The manifold is arranged to receive gas from the upstream source and to flow the gas through the manifold and either the first or second inlet line, so that one of such lines is actively flowing gas from the upstream source to the downstream process, while the other is blocked by closure of the respective valve therein to flow of the gas therethrough.

A pressurized water source is coupled with the manifold, by water flow lines to each of the first and second inlet lines. Each of the water flow lines contains a valve, e.g., a pneumatic valve. Each of the valves is selectively openable or closeable to establish or discontinue flow of pressurized water therethrough, respectively.

A heat source may be thermally coupled to each of the first and second inlet lines, e.g., by a thermal jacket placed about each of the first and second inlet lines, to selectively elevate the temperature within at least one of the two inlet lines.

In operation, gas from the upstream process flows into the manifold. During active processing, the valve in one of the first and second inlet lines is open, while the valve in the other of the first and second inlet lines is closed, so that the gas entering the manifold is flowed through the specific one of the inlet lines containing the opened valve. In this manner, the gas flows through the specific one of the inlet lines containing the open valve, and passes to the downstream process. The inlet line containing the open valve is sometimes hereinafter for ease of reference referred to as the "open inlet line," while the other inlet line of the manifold is referred to as the "off-stream line." In the off-stream line, the valve is closed to prevent flow of gas therethrough.

The valves of the inlet lines may be operationally coordinated and controlled by suitable cycle timer means and controls of a common and conventional type, as adapted to the apparatus of the present invention.

The off-stream line, while not flowing gas therethrough, is cleaned to regenerate same for further processing. Thus, in the continuous operation of the apparatus, the valves in the respective inlet lines are controlled so that one of such valves is open at any given time, while the other is closed for off-stream cleaning of the line and renewal of the line for subsequent on-stream operation.

The off-stream line is cleaned by admission of pressurized water from the pressurized water source to the off-stream line by opening of the valve in the water flow line communicating the pressurized water source with the off-stream line. In the other water flow line, the water flow line valve is closed, to prevent the flow of the pressurized water from the water source to the on-stream line.

In this manner, the off-stream line, now vacant due to its isolated state, is subjected to a vigorous cleaning including pressurized water washing.

Optionally, a pressurized drying gas source is coupled with the manifold, by drying gas flow lines to each of the first and second inlet lines. Each of the drying gas flow lines contains a valve, e.g., a pneumatic valve. Each of the valves is selectively openable or closeable to establish or discontinue flow of pressurized drying gas therethrough, respectively.

After pressurized water flow through the off-stream line, the off-stream line may be dried to ready it for subsequent renewed flow of gas from the upstream source to the downstream process. This is effected by closure of the valve in the pressurized water flow line, to discontinue the pressurized water flushing/scrubbing action of the water on the internal surfaces of the off-stream line. Concurrently, the valve in the drying gas flow line communicating with the off-stream line is opened to admit pressurized drying gas into the off stream line for flow therethrough, to dry the interior surfaces of the off-stream line, so that the flushing water is completely removed from the off-stream line of the manifold. In this manner, the off-stream line may be completely dried to avoid hydrolysis reactions in the subsequent operation of the overall system, when process gas flow through the cleaned and dried line is resumed, viz., when the off-stream line again becomes the on-stream line, and the former on-stream line is taken off-line.

The changeover operation for such sequence involves first opening the valve in the off-stream line to accommodate the subsequent flow of process gas therethrough. Once the valve in the off-stream line is verified open, the valve in the drying gas line is closed. This procedure prevents any occurrence of both valves being simultaneously closed and creating a deadhead condition in the upstream process flow.

In this manner, the manifolded gas processing system is operated so that gas is flowed from the upstream source through an inlet line to the downstream process, with the gas flow being alternatingly, and sequentially directed through each of the inlet lines, so that during the off-stream period of a given inlet line, it is being flushed with pressurized water, and optionally, and preferably, dried by flow therethrough of pressurized drying gas, to renew the inlet line for subsequent flow of gas therethrough.

The water from the pressurized water flush and the pressurized gas drying steps may be flowed through the off-stream inlet line and may be discharged into the water scrubber, or alternatively may be vented from the off-stream line through valved discharge lines dedicated for such purpose. In the processing of semiconductor manufacture effluent gases by downstream scrubbing, it is generally advantageous to discharge the flush water and the pressurized drying gas into the downstream scrubber.

The first and second inlet lines may also be provided with associated heating means, such as an electrical resistance heater, stream tracing lines, or heating jackets, by which the drying process may be carried out more rapidly, and/or to provide process heat to otherwise facilitate the cleaning of the inlet lines of the manifold.

In a process aspect, the present invention relates to a method of flowing a gas from an upstream source to a downstream process through a manifold including two inlet lines through which gas may flow, by the steps of:

(a) flowing the gas through one of the inlet lines as an on-stream inlet line, while the other inlet line is isolated to flow of gas from the upstream source to the downstream process;

(b) flushing the isolated inlet line with pressurized water to remove particulate solids, water soluble solids, and the like from interior surfaces of the isolated inlet line;

(c) discontinuing the flow of pressurized water through the isolated inlet line;

(d) optionally, flowing pressurized drying gas through the isolated inlet line to dry said interior surfaces of said isolated inlet line;

(e) discontinuing the flow of the pressurized drying gas through the isolated inlet line;

(f) de-isolating the isolated inlet line, to constitute same an on-stream inlet line;

(g) discontinuing the flow of gas through the on-stream inlet line, and isolating the on-stream inlet line to constitute same an isolated off-stream inlet line;

(h) redirecting the flow of said gas from the upstream source to the downstream process through the de-isolated on-stream inlet line;

and cyclically, alternatingly and repetitively conducting steps (a)–(h), so that during flow of gas from the upstream source to the downstream process, one of the inlet lines has the gas from the upstream source flowed therethrough, and the other of the inlet lines is off-stream, and undergoes high-pressure water flushing and, optionally, drying.

The process may also optionally be carried out with heating of the inlet lines.

Other aspects, features and embodiments of the invention will be more fully appreciated from the ensuing disclosure and appended claims.

DETAILED DESCRIPTION OF THE INVENTION, AND PREFERRED EMBODIMENTS THEREOF

This application is related to U.S. application Ser. No. 08/778,386, filed 31 Dec. 1996, entitled "Clog-Resistant Entry Structure for Introducing a Particulate Solids-Containing and/or Solids Forming Gas Stream to a Gas Processing System" (E-167); and to U.S. application Ser. No. 08/775,838, filed on 31 Dec. 1996, entitled "Effluent Gas Stream Treatment System Having Utility for Oxidation Treatment of Semiconductor Manufacturing Effluent Gases" (E-163). The teachings of these United States applications are incorporated herein by reference as if fully set forth herein.

Figure 1:
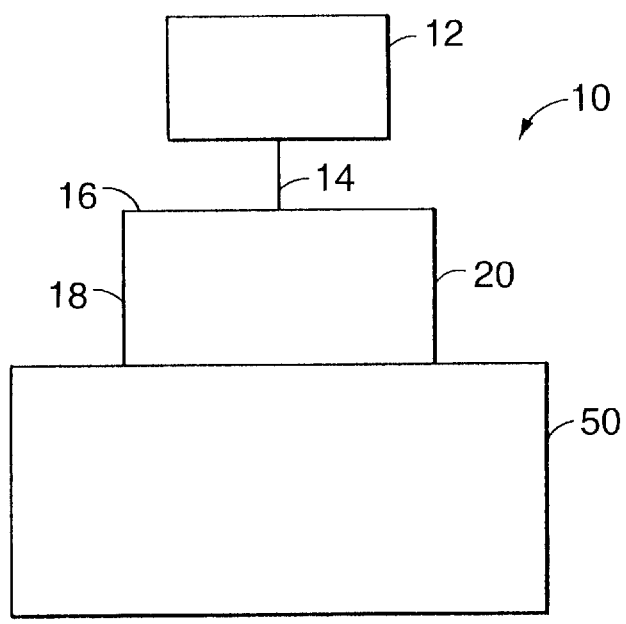
FIG. 1 is a schematic representation of a system including (1) an upstream semiconductor manufacturing system; (2) a manifold assembly; and (3) a downstream scrubber unit.

Referring now to the drawings, FIG. 1 is a schematic representation of system 10 including an upstream system 12 producing an effluent gas, an exit line 14, a manifold duct line 16, first and second inlet lines 18 and 20; and a downstream scrubber unit 50. As depicted, the upstream system, which may for example comprise a semiconductor manufacturing facility or semiconductor process tool, is in closed gas flow communication with the scrubber unit via the manifold and inlet lines. The exit line, manifold line and inlet lines may have any suitable diameter, e.g., a diameter ranging from 1.5 to 3 inches.

Figure 2:
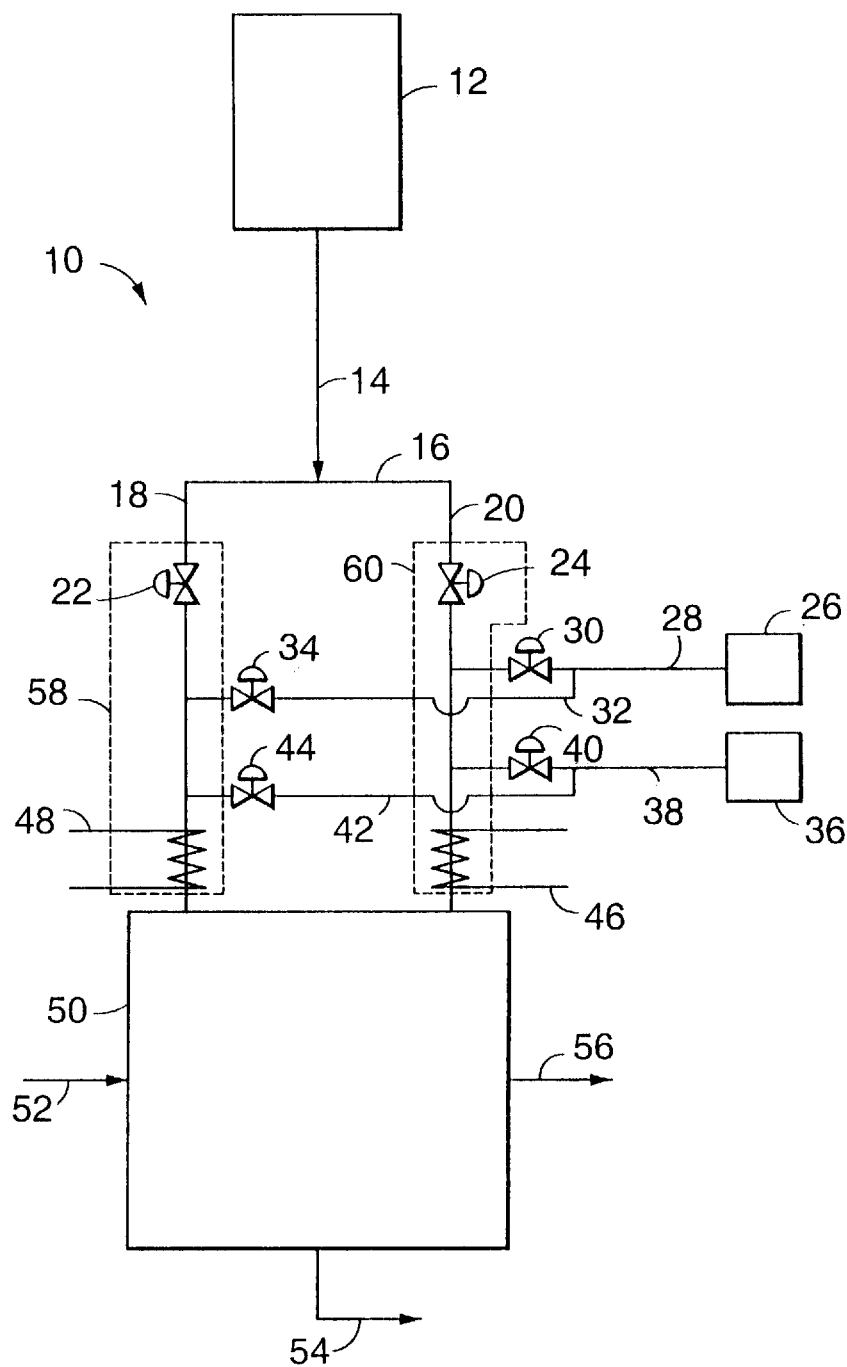
FIG. 2 is a schematic representation of an illustrative embodiment of the invention.

FIG. 2 is a schematic representation of an illustrative embodiment of the present invention. The upstream system 12, e.g. semiconductor manufacturing tool, is connected to an exit line 14. Exit line 14 has walls defining an elongated tubular shape with an internal flow passage and a first end upstream from a second end. The internal flow passage of exit line 14 is connected at its first end to the upstream system 12 to receive effluent gas from the upstream system. The second end of exit line 14 is connected at an approximate midpoint of intake manifold line 16. Intake manifold line 16 has walls defining an elongated body with an internal flow passage, and first and second ends. The first and second ends of intake manifold line 16 are downstream from the approximate midpoint connection with exit line 14. The connection of exit line 14 and manifold 16 facilitates the effective passage of effluent gas from the interior flow passage of line 14 to the interior flow passage of manifold line 16.

First and second intake lines 18 and 20 have walls defining internal passages, and first and second ends. The respective first ends of intake lines 18 and 20 are connected to the first and second ends of manifold line 16 thereby facilitating passage of the effluent gas from the internal flow passage of manifold line 16 to the internal flow passages of intake lines 18 and 20. The second ends of intake lines are downstream from the first ends. The respective second ends of the intake lines 18 and 20 are connected to scrubber unit 50.

Scrubber 50 is connected as shown to a scrubber water line 52. The connection facilitates passage of water, from scrubber water line 52 into scrubber 50. The scrubber 50 is also connected to a vent gas discharge line 54, to provide for passage of gas from scrubber 50 through line 54 to a discharge location. The scrubber 50 is also connected to a fluid waste line 56, to provide uninterrupted passage of liquid waste from scrubber 50 to a liquid waste discharge location. The scrubber water line 52, vent gas discharge line 54, fluid waste line 56, exit line 14, manifold intake line 16 and first and second intake lines 18 and 20, may be of any suitable diameter, appropriate to the specific gas flow rates and processing unit operations involved in the facility.

The connection between the manifold intake line and the first and second intake lines is angled between 45 and 90 degrees so that the internal passage of the manifold line serves as a water baffle retarding back migration of water from within the internal passages of the first and second intake lines.

Connected proximate to the upstream ends of the first and second intake ducts are first and second intake valves 22 and 24. The intake valves are two-way valves, each having an open and closed position. When in a closed position, the intake valve prevents the flow of effluent gas from the manifold line 16 into the intake lines.

Positioned proximate to the second, downstream ends of the intake lines are first and second heating means 46 and 48. Although depicted as heater coils, the heating means may comprise any heating systems known to the skilled artisan for transferring thermal energy to the internal passages of the first and second inlet lines. For purposes of illustration, the heating means will be referred to as heating coils.

A gas delivery system for delivering gas from a gas source into the interior passages of the first and second intake lines will now be described. The gas delivery system of the present invention includes a gas source 26, first and second gas delivery lines 28 and 32 having internal passages, first and second ends, and first and second gas flow control valves 30 and 34 therein.

Its in understood the gas delivery system described herein may include more than one gas source. Multiple gas sources would be connected in gas flow communication to a gas source manifold. The gas source manifold may include an gas source isolation valve for each gas source and a gas source flow control valve for each gas source. The gas source manifold would then be connected in gas flow communication to the gas delivery system.

Gas source 26 is positioned proximate to the first and second intake lines. Gas source 26 furnishes gas, such as nitrogen, for delivery at rate of 2 to 100 standard cubic feet per hour, into the internal passages of the first and second intake lines 18 and 20. Effective gas delivery into the intake lines is facilitated by the connection (by any suitable connection means, such as couplings, connectors, etc.) of the first and second gas delivery lines to the first and second intake lines.

Gas source 26 is connected to the first gas delivery line 28 at the first end of line 28. The first end of a second gas delivery line 32 is connected at an approximate midpoint along the length of first gas delivery line 28. The connection between said first gas line 28 and second gas line 32 is such that gas contained in line 28 passes without obstruction or leakage into the interior passage of line 32. Second gas delivery line 32 is connected to line 28 at a point along the length of line 28 downstream from the connection between line 28 and gas source 26.

A downstream end of first gas delivery line 28 is connected to a length of second intake line 20 downstream from second valve 24. The connection between gas line 28 and intake line 20 provides an unobstructed passageway for gas contained in the internal passage of gas line 28 to pass freely and without leakage into the interior passage of intake line 20. A second end of second gas delivery line 32, downstream from the first end of line 32 is connected to first intake line 18. The connection between gas line 32 and intake line 18 provides an unobstructed passageway for gas in line 32 to pass freely and without leakage into the interior of intake line 18.

Positioned along first gas delivery line 28, upstream from the connection with second intake line 20 and downstream from the connection with second gas delivery line 32, is first gas valve 30. First gas valve 30 is a two way valve equivalent to the first and second intake valves discussed above. First gas valve 30 regulates the passage of gas along the interior of first gas delivery line 28 into second intake line 20. Positioned on the second gas delivery line, upstream from the connection with the first gas line, is second gas valve 34. Second gas valve 34 facilitates the passage of gas therethrough from the second gas line into the first intake line.

A pressurized water delivery system will now be described. The water delivery system includes a water source 36, first and second water lines 38 and 42 having first and second ends and internal passages, and first and second water valves 40 and 44.

Positioned proximate to the first and second intake lines is pressurized water source 36. Pressurized water source 36 produces a stream of water at a pressure ranging from 0.5 to 5 gallons per minute. Water source 36 is connected to the internal passage of the first water line 38 at the first end of line 38. The connection facilitates the effective passage of pressurized water from the source into the internal passage of line 38. The second end of first water line 38, downstream from said first end, is connected to second intake line 20 for the delivery of the pressurized water from the internal passage of first water line 38 into the internal passage of second intake line 20. Positioned on first water line 38, upstream from the connection with second intake line 20, is a first water valve 40 for facilitating the selective passage of pressurized water therethrough and into intake line 20. First water valve 40 is a two way valve.

A first end of second water delivery line 42 is connected to first water delivery line 38 at a location upstream from first water valve 40 and downstream from water source 36. The second end of second water delivery line 42, downstream from the first end, is connected to first intake line 18 for the delivery of pressurized water from the internal passage of line 38 into the internal passage of intake line 18. Positioned on the second water line, upstream from the connection to the first intake line 18, is second water valve 44 for selectively controlling the passage of pressurized water therethrough. Second water valve 44 is a two way valve.

A first thermal jacket 58 accommodates a length of first intake line 18, first intake valve 22, the connection between line 18 and second gas delivery line 34, the connection between line 18 and second water delivery line 42, and first heating means 48. The first thermal jacket provides insulating properties to the elements accommodated therein and cooperates with the heating means to raise an internal thermal temperature of first intake duct line 18. Thermal jacket 58 raises side wall temperature while $N_2$ is flowing to evaporate water deposited on the side wall, and thermal jacket 58 raises the side wall temperature to prevent condensable process gases from condensing in the line. In the metal etch example $BCl_3$ from the process will form boric acid upon hydrolysis reaction at the entry to the scrubber, yet, the process line must be heated to prevent $AlCl_3$ from condensing along the line as well. The line may, then, be heated from the process source as is the case for metal etch or WCVD.

A second thermal jacket 60 accommodates a length of second intake line 20, second intake valve 24, the connection between line 20 and first gas line 28, the connection between line 20 and first water line 38, and second heating means 46. The second thermal jacket provides insulating properties to the elements accommodated therein and cooperates with the heating means to raise an internal thermal temperature of second intake line 20.

The valves mentioned above are two way valves each having an open position and a closed position. For purposes of discussion hereafter, it will be assumed that the valves are pneumatic valves with an air open and spring close mode of operation (the valves may, though be air to close, spring to open depending upon the system requirements, performance, and objectives). Such pneumatic valves may include KF-50 connections, electro-pneumatic with integral air solenoid valve, and proof of closure and proof of open switches leads. Such valves are available from HPS Division of MKS Instruments as model 190. Electrical connections between the above mentioned and below cited valves are maintained to a control panel (not shown). The control panel includes a programmable logic controller (PLC) in electrical connection with the system valves. The PLC maintains electrical connections with the valves to monitor valve position and actuate valve position (open or close). In addition, a timer is associated with the PLC to facilitate PLC timing of valve positions. However, it will be understood by the skilled artisan that other valves and control embodiments may be substituted without departing from the spirit or scope of the present invention. For example, the valves may be electrical, mechanical, electromechanical, magnetic, or other type valves, of any of various commercially available types. The valves may, in particular, include limit switches electrically coupled to the cycle timer control means or an alternate control means. The limit switches would provide valve position verification and control interlock to ensure the process gas flow is not deadheaded and to assist in preventing water from being introduced into an on-line (on-stream) gas flow line.

Figure 3:
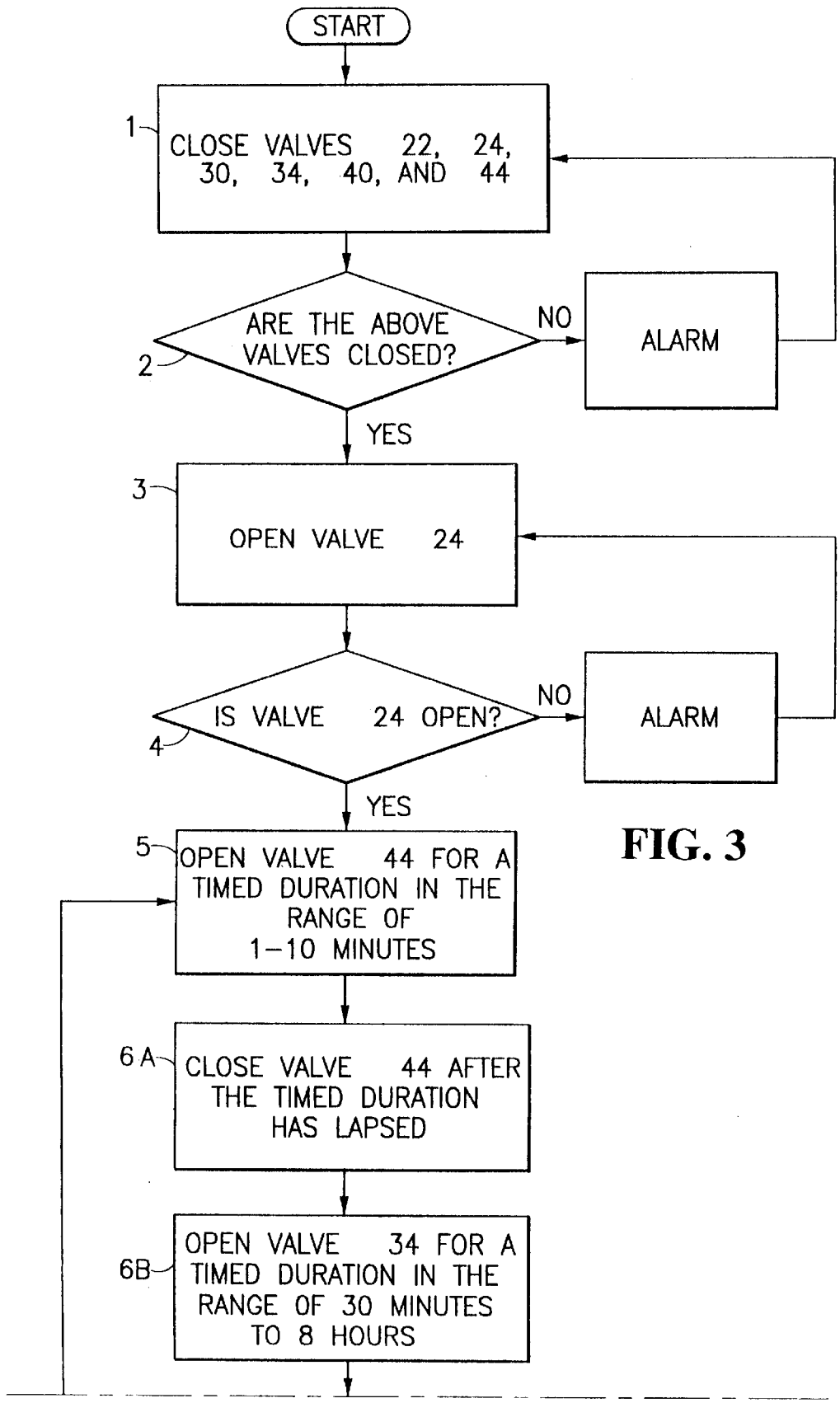
FIG. 3 is a block diagram of the steps of a cleaning cycle as may be carried out in the illustrative embodiment of FIG. 2.
Figure 3:
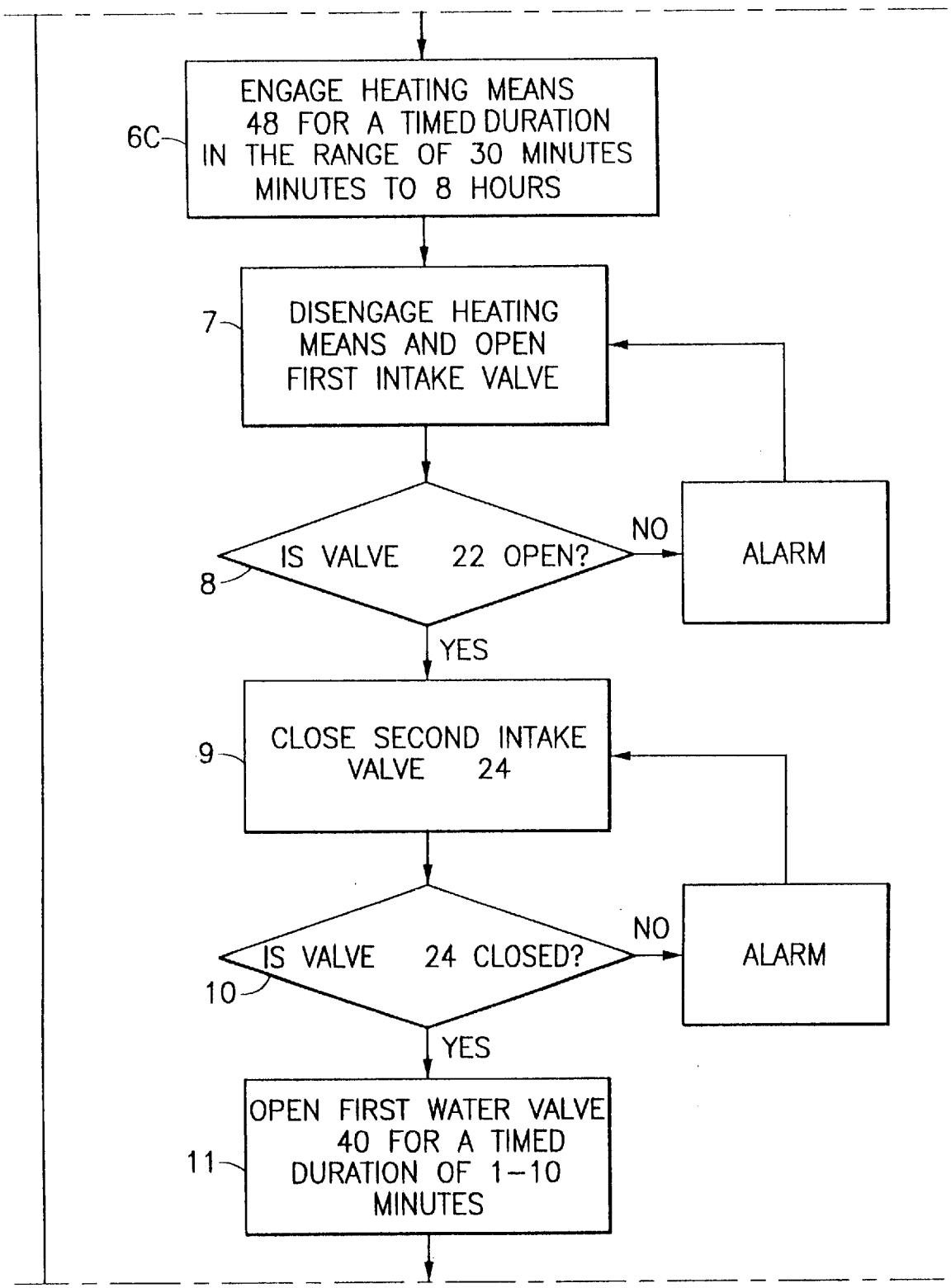
Figure 3:
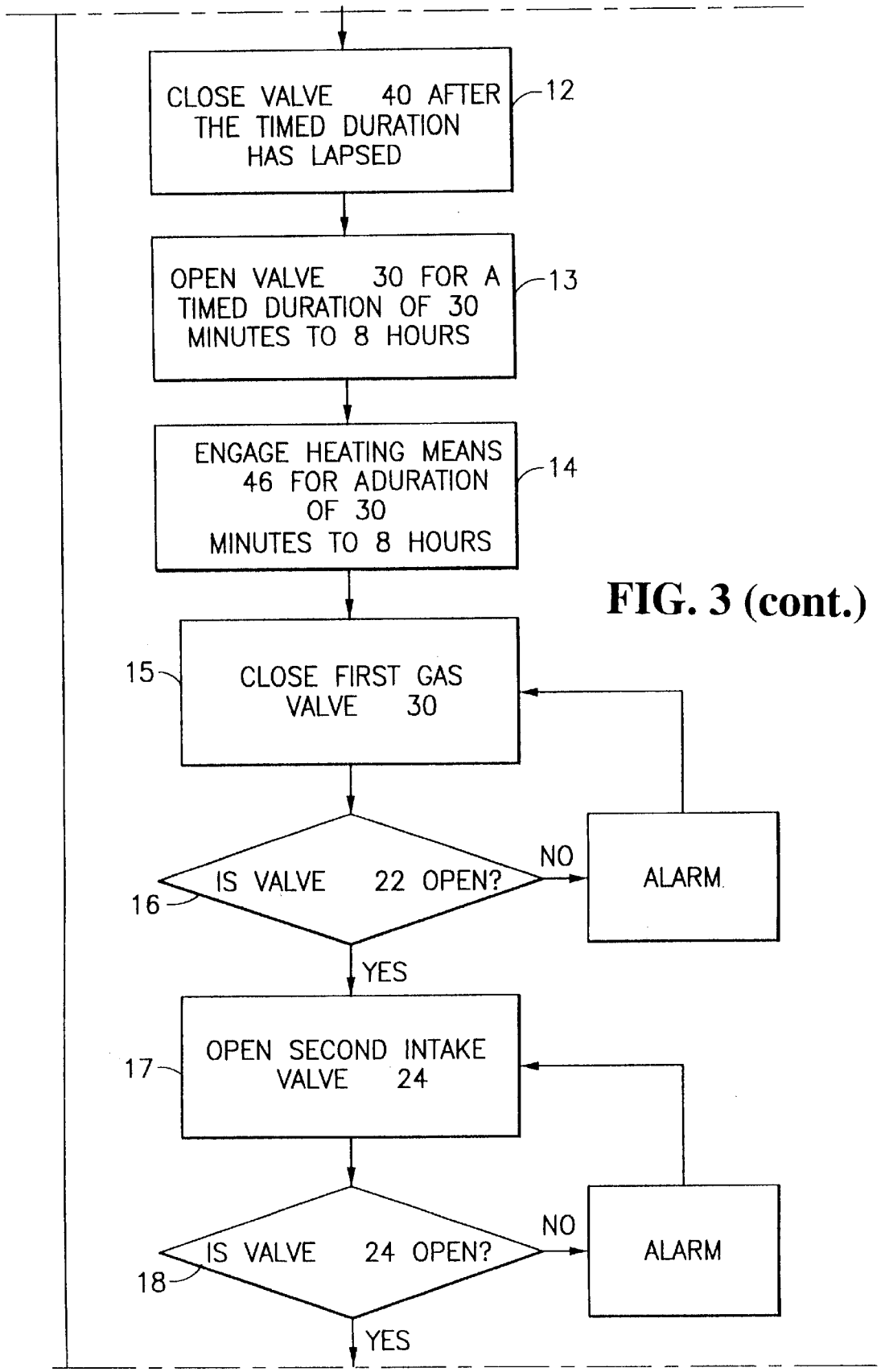
Figure 3:
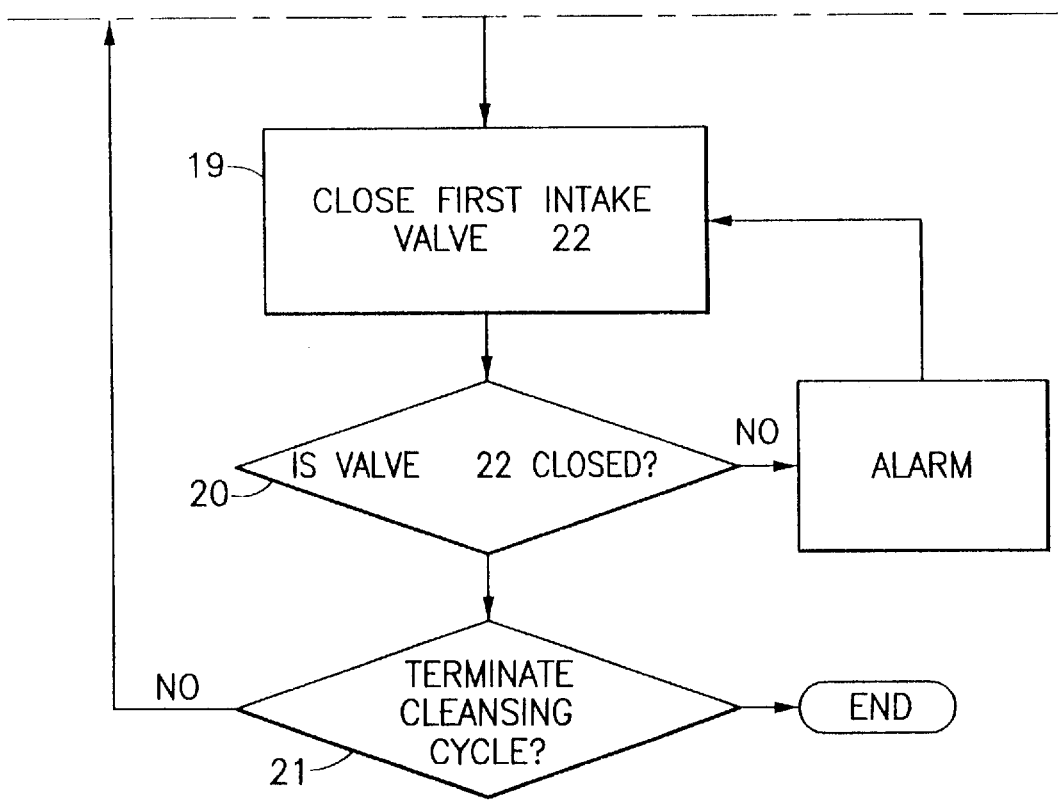

The method of operation of the above-described embodiment of FIG. 2 of the present invention is described below with reference to the flowchart of FIG. 3. Such description identifies the apparatus with respect to the reference numerals of FIG. 2.

A first step (block 1 in the FIG. 3 flowchart) in the operation of the present invention is to close all valves: 22, 24, 30, 34, 40, and 44. The programmable logic controller (PLC) controls the opening and closing of the valves by regulating the flow of pneumatic air thereto (not shown). The cessation of pneumatic air to a valve causes a spring to move a valve baffle to an obstructing position, thereby preventing the flow of gas stream material from a position upstream of the valve to a position downstream of the valve. The first step prevents the flow of any effluent gas, pressurized water, or other gas, through any of the duct lines set out above. This initial step is a safety precaution prior to use of the apparatus of the present invention, to ensure that an operator is always aware of which intake duct lines are being occupied by a stream of effluent gas from the upstream system 12. The initial step ensures that the flow of effluent gas (along with pressurized water and gas from gas source 36) has not yet begun.

A second step (block 2 in the FIG. 3 flowchart) in the operation of the present invention involves querying whether all the valves are shut. This query is executed by the PLC housed in the control panel. As set out above, the PLC is in electrical communication with electrical position indicator means housed within the aforementioned valves. This query is carried out by the PLC detecting signals from the positioned indicator means and associating same with predetermined valves indicative of a closed position. When it is determined that the aforementioned valves are in the closed position, the third step is initiated. When it is determined that the aforementioned valves are in an open position, an alarm is sounded and the prior step is repeated.

A third step (block 3 in the FIG. 3 flowchart) entails opening second intake valve 24. The opening of valve 24 may be accomplished by allowing the flow of pneumatic air into the valve, thereby causing an internal spring to adjust the position of a valve baffle into one which allows the passage of effluent gas from manifold 16, through second intake valve 24 and into second intake line 20. The opening of second intake valve 24 is activated by the PLC. First intake valve 22 is held in a closed position thereby sealing off the first intake line from the flow of effluent and off gas causing same to flow exclusively through the second intake line 20.

A fourth step (block 4 in the FIG. 3 flowchart) entails querying whether the second intake valve 24 has been opened. The query into the valve position is carried out by the PLC in the same manner as the valve position query set out in step two. If the PLC determines that the second intake valve is closed, an alarm is sounded and the prior step is repeated. If the PLC detects the intake valve to be open, the next step in the operating procedure is implemented.

A fifth step (block 5 in the FIG. 3 flowchart) entails opening second water valve 44. The opening of valve 44 is performed by the PLC in a similar manner as described above. The opening of valve 44 creates an outlet for the flow of pressurized water from water source 36, through first water delivery line 38 and second water delivery line 42, into first intake line 18. First water valve 40 is maintained in a closed position to ensure that no water from water source 36 passes therethrough and into second intake line 20. Valve 44 is held open by the PLC for a first duration of time set and monitored by a timer associated with the PLC. Second water valve 44 is held open for a time in the range of one to ten minutes. The flow of pressurized water into first intake line 18 flushes out and scours the internal passage of line 18, as well as dissolving soluble particulate, thereby causing particulates and the like to exit through the first intake line second end into scrubber unit 50.

A sixth step (block 6A in the FIG. 3 flowchart) entails closing water valve 44 after the first duration of time has passed. After second water valve 44 has been closed, second gas valve 34 is opened (block 6B in the FIG. 3 flowchart) and, if not already activated, the first heating means is activated (block 6C in the FIG. 3 flowchart). The closing and opening of the valves is carried out by the PLC in a manner as described above. The first heating element is activated by generating a current flow therethrough, controlled by the PLC. The current flow encounters the natural resistance of the heating means and generates heat due to the ensuing electrical resistance. Second gas valve 34 is kept open for a second duration of time as set and monitored by the timer associated with the PLC. A preferred range of time for leaving second gas valve open and activation of the heating means is from thirty minutes to eight hours. First gas valve is maintained in a closed position so that the flow of gas from gas source 26 is directed along first gas delivery line 28 to second gas delivery line 32 and first intake line 18. The gas, in cooperation with heat delivered by first heating means 48, dries the interior walls of the first inlet line.

A seventh step (block 7 in the FIG. 3 flowchart) entails disengaging the first heating means and opening first intake valve 22. The opening of the valve 22 is carried out by a similar manner as described above. The heating means is disengaged by the cessation of current thereto as controlled by the PLC.

An eighth step (block 8 in the FIG. 3 flowchart) entails querying whether first intake valve 22 is open. The query is carried out by the PLC in a similar querying manner as set out above. If the PLC determines that the first intake valve is not open, an alarm is activated and step seven is repeated. Only when the PLC confirms the newly cleaned inlet is open will the PLC close the other inlet for cleaning; otherwise the flow of process gas could be blocked. If the PLC determines that the first intake valve is open, the next step in the operating procedure is implemented.

A ninth step (block 9 in the FIG. 3 flowchart) entails closing second intake valve 24. First intake valve 22 is maintained in an open position. The closing of the second intake valve 24 causes the flow of effluent to become diverted from a now closed off second inlet line to a now open first inlet line.

A tenth step (block 10 in the FIG. 3 flowchart) entails querying whether second intake valve 24 is closed. The query is carried out by the PLC in electrical connection with the second intake valve as set out above. If the PLC determines that the second intake valve is not closed, an alarm is activated and the ninth step is repeated. If the second intake valve is determined to be closed the next step in the operating procedure is implemented.

An eleventh step (block 11 in the FIG. 3 flowchart) entails opening first water valve 40. The second water valve 44 is maintained in a closed position. The opening of the first water valve (and the closed second water valve 44) opens a passage for pressurized water to flow from the water source 36 through first water delivery line 38 and first water valve 40 and into second intake line 20. Second water valve 44 is maintained in a closed position to ensure that no water passes therethrough and into first inlet line 18. The pressurized water flows through second intake line 20 performing scouring and cleaning actions as set out above with regard to the first intake line. The pressurized water exits the second intake line through a second end connected to scrubber 50. The pressurized water is allowed to flush out the second intake line for a preselected time ranging from one to ten minutes. An adjustable timer, in electrical connection with the PLC, cooperates with same to time the discharge of the pressurized water.

A twelfth step (block 12 in the FIG. 3 flowchart) entails closing first water valve 40, a thirteenth step entails opening first gas valve 30 (block 13 in the FIG. 3 flowchart), and a fourteenth step (block 14 in the FIG. 3 flowchart) entails activating second heating means 46. The opening and closing of the valves is carried out by the PLC in a similar manner as described above. The second gas valve 34 is maintained in a closed position to ensure that no gas passes therethrough and into first inlet duct line 18. The opening of first gas valve 30 opens a passage for gas to flow from gas source 26, through first gas delivery line 28 and first gas valve 30, and into second inlet line 20. The activation of the second heating means causes, in cooperation with the second thermal jacket 60, the internal temperature of the second inlet line to rise. The gas and heat generated from the second heating means, dries the interior passage of the second inlet line 20. The gas flows through the second inlet line and into the scrubber 50 via the line's second end. The first gas valve is held open and the second heating means is activated for a time duration ranging from thirty minutes to height hours. The time duration is monitored by a timer associated with the PLC as described above.

A fifteenth step (block 15 in the FIG. 3 flowchart) entails closing first gas valve 30 and disengaging second heating means 46 after the time duration has been reached. In a sixteenth step (block 16 in the FIG. 3 flowchart), the PLC queries the first intake valve 22 to ensure the valve remains in an open condition. The operation of the valves is performed in a manner as set out above.

A seventeenth step (block 17 in the FIG. 3 flowchart) entails opening second intake valve 24 and querying (block 18 in the FIG. 3 flowchart) by the PLC as to whether the second intake valve 24 is open. If it is determined that the second intake valve is not open, an alarm is activated and the previous step is repeated. The PLC performs the querying process in a manner as set out above.

A nineteenth step (block 19 in the FIG. 3 flowchart) entails closing first intake valve 22 and querying (block 20 in the FIG. 3 flowchart) to ensure first intake valve is closed. If valve 22 is not closed, an alarm is sounded and the previous step is repeated. If first intake valve 22 is closed, the operational procedure queries the operator as below.

Finally the operator is queried (block 21 in the FIG. 3 flowchart) as to whether to repeat the cleaning steps set out above, returning the to fifth step, or ending the cleaning cycle.

Thus, while the invention has been described with reference to specific variations, modifications and embodiments of the invention, it will be appreciated that the invention is not thus limited but extends to variations, modifications, and embodiments other than those specifically disclosed, and the invention is therefore to be broadly construed and interpreted as encompassing all such variations, modifications and other embodiments, within its spirit and scope.

What is claimed is:

1. An apparatus for conveying a process gas stream from an upstream source to a downstream treatment unit, comprising:

a manifold receiving gas from the upstream source, including first and second inlet lines which are alternatingly employed to flow gas to a downstream process, each of said inlet lines at their first ends being joined to a manifold conduit, and each of the first and second inlet lines at their second ends being joined in flow communication with the downstream treatment unit;

each of the first and second inlet lines including a valve therein which is selectively openable or closeable to establish or discontinue flow of gas therethrough, respectively;

the manifold being arranged to receive gas from the upstream source and to flow the gas through the manifold and either the first or second inlet line, so that one of such lines is actively flowing gas from the upstream source to the downstream process, while the other is blocked by closure of the respective valve therein to flow of the gas therethrough;

a pressurized water source coupled with the manifold, by water flow lines to each of the first and second inlet lines, with each of said water flow lines containing a valve which is selectively openable or closeable to establish or discontinue flow of pressurized water therethrough, respectively; and cycle timer control means constructed and arranged to control the operation of the manifold and valves so that in operation, gas from the upstream source flows into the manifold, with the valve in one of the first and second inlet lines being open, while the valve in the other of the first and second inlet lines is closed, so that the gas entering the manifold is flowed through a specific one of the inlet lines containing the opened valve, so that the gas flows through the specific one of the inlet lines containing the open valve and constituting an on-stream line, and passes to the downstream process, while the other inlet line of the manifold constitutes an off-stream line in which the valve is closed to prevent flow of gas therethrough;

the off-stream line, while not flowing gas therethrough, is cleaned to regenerate same for further processing so that the valves in the respective inlet lines are controlled with one of such valves being open at any given time, while the other is closed for off-stream cleaning of the line and renewal of the line for subsequent on-stream operation;

the off-stream line is cleaned by admission of pressurized water from the pressurized water source to the off-stream line by opening of the valve in the water flow line communicating the pressurized water source with the off-stream line, while in the other water flow line, the water flow line valve is closed, to prevent the flow of the pressurized water from the water source to the on-stream line, and after pressurized water has been flowed through the off-stream line for cleaning thereof, the inlet line valves in the respective inlet lines are switched to an opposite open/closed state;

with the gas flow being alternatingly, and sequentially directed through each of the inlet lines, so that during the off-stream period of a specific inlet line, the off-stream line is being flushed with pressurized water, to renew the inlet line for subsequent flow of gas therethrough.

2. An apparatus according to claim 1, further comprising means for drying the off-stream line subsequent to water washing thereof.

3. An apparatus according to claim 2, wherein the drying means include a source of drying gas, dry gas lines interconnecting each of the inlet lines to the drying gas source, and valves in the dry gas lines for selectively flowing or preventing flow of drying gas therethrough, wherein the valves are controlling coupled with the cycle timer control means.

4. An apparatus according to claim 1, further comprising means for heating the off-stream line, to enhance drying thereof.

5. An apparatus according to claim 4, wherein the heating means comprise a resistance heating element.

6. An apparatus according to claim 1, wherein each of said valves is a pneumatic valve.

7. An apparatus according to claim 1, wherein the water from the pressurized water source after flow through the off-stream inlet line is discharged into the downstream process.

8. An apparatus according to claim 1, wherein the upstream source is a semiconductor manufacturing tool.

9. An apparatus according to claim 1, wherein the downstream process is a water scrubbing process.

10. An apparatus according to claim 1, wherein the cycle timer control means includes at least one limit switch to determine a position of a valve.

11. An apparatus according to claim 1, wherein the cycle timer control means operates to prevent the first and second inlet lines from being simultaneously closed.

12. An apparatus according to claim 1, wherein the cycle timer control means operates to prevent pressurized water from flowing into an on-stream line.

13. An apparatus for conveying a process gas stream from an upstream source to a downstream treatment unit, comprising:

a manifold arranged between the upstream source and the downstream treatment unit including valved multiple lines which are constructed and arranged so that one of said valved multiple lines flows the process gas stream from the upstream source to the downstream treatment unit while another of said valved multiple lines is off-stream;

flushing means for flushing an off-stream line for cleaning thereof; and a timer control coupled to the flushing means and arranged for alternatingly and sequentially flushing each of the valved multiple lines for cleaning thereof, wherein each of the valved multiple lines is cyclically taken off-line by the timer control and while an off-stream line is cleaned, an on-stream line is open to flow the process gas stream from the upstream source to the downstream treatment unit.

14. An apparatus according to claim 13, wherein the flushing means flush the off-stream line with an aqueous medium.

15. An apparatus according to claim 13, wherein the off-stream line is dried by flowing a drying gas therethrough before being alternated to operation as an on-stream line.

16. An apparatus according to claim 13, wherein the valved multiple lines comprise pneumatic valves.

17. An apparatus according to claim 13, wherein the upstream source of the process gas is a semiconductor manufacturing tool.

18. An apparatus according to claim 13, wherein the downstream treatment process is a water scrubbing process.

19. An apparatus according to claim 13, wherein the timer control includes at least one limit switch to determine valve position in the valved multiple lines.

20. An apparatus according to claim 13, wherein the upstream process comprises a semiconductor manufacturing facility.

21. An apparatus according to claim 20, wherein the semiconductor manufacturing facility comprises means for carrying out a semiconductor manufacturing step selected from the group consisting of etch processing, epitaxial film formation processes, and semiconductor manufacturing equipment cleaning operations.

22. An apparatus according to claim 13, wherein the timer control comprises programmable logic controllers constructed and arranged to monitor valve position and actuate valve opening and closing in the valved multiple lines.

23. An apparatus according to claim 22, further comprising limit switches that are constructed and arranged to provide valve position verification and control interlock, to ensure that the process gas stream is not deadheaded and to prevent flushing media from being introduced into an on-stream valved line.

* * * * *

UNITED STATES PATENT AND TRADEMARK OFFICE
CERTIFICATE OF CORRECTION

PATENT NO : 5,882,366

DATED : Mar. 16, 1999

INVENTOR(S) : Mark R. Holst and Patrick Balliew

It is certified that error appears in the above-identified patent and that said Letters Patent are hereby corrected as shown below:

Column 1, line 15:  change " . . .Gases"." to --Gases."--.

Signed and Sealed this

Twenty-fourth Day of April, 2001

Attest:

NICHOLAS P. GODICI

*Attesting Officer*   *Acting Director of the United States Patent and Trademark Office*